(12) United States Patent
Tao

(10) Patent No.: US 7,009,302 B2
(45) Date of Patent: Mar. 7, 2006

(54) MICROMACHINE PACKAGE AND METHOD FOR MANUFACTURING THE SAME

(75) Inventor: Su Tao, Kaohsiung (TW)

(73) Assignee: Advanced Semiconductor Engineering, Inc., (TW)

( * ) Notice: Subject to any disclaimer, the term of this patent is extended or adjusted under 35 U.S.C. 154(b) by 0 days.

(21) Appl. No.: 10/826,261

(22) Filed: Apr. 19, 2004

(65) Prior Publication Data

US 2005/0017334 A1    Jan. 27, 2005

(30) Foreign Application Priority Data

Jul. 24, 2003    (TW) ............................... 92120272 A

(51) Int. Cl.
*H01L 23/48*    (2006.01)
*H01L 23/52*    (2006.01)
*H01L 29/40*    (2006.01)

(52) U.S. Cl. ...................... 257/777; 257/414; 257/415; 257/419; 257/778; 257/678; 257/686; 361/760; 438/108; 438/109

(58) Field of Classification Search ................ 257/414, 257/415, 419, 777, 678, E27.137, E23.169–E23.178, 257/E27.161, E27.144, 778, 686; 361/760; 438/108, 109

See application file for complete search history.

(56) References Cited

U.S. PATENT DOCUMENTS

| 5,323,051 | A | | 6/1994 | Adams et al. ............... 257/417 |
|---|---|---|---|---|
| 5,587,341 | A | * | 12/1996 | Masayuki et al. ........... 438/109 |
| 5,925,936 | A | | 7/1999 | Yamaji ........................ 257/787 |
| 6,004,867 | A | | 12/1999 | Kim et al. ................... 438/459 |
| 6,133,637 | A | * | 10/2000 | Hikita et al. ................. 257/777 |
| 6,239,366 | B1 | * | 5/2001 | Hsuan et al. ............... 174/52.3 |
| 6,303,986 | B1 | * | 10/2001 | Shook ......................... 257/680 |
| 6,316,840 | B1 | * | 11/2001 | Otani .......................... 257/787 |
| 6,323,550 | B1 | * | 11/2001 | Martin et al. ................ 257/704 |
| 6,415,505 | B1 | * | 7/2002 | Glenn .......................... 29/852 |
| 6,522,015 | B1 | * | 2/2003 | Glenn et al. ................. 257/777 |
| 6,534,340 | B1 | * | 3/2003 | Karpman et al. ........... 438/113 |

* cited by examiner

*Primary Examiner*—Tom Thomas
*Assistant Examiner*—Chris C. Chu

(57) ABSTRACT

A micromachine package includes a first chip, a second chip, a spacer ring, a plurality of bumps, a plurality of leads, and an encapsulant. The first chip has at least one moveable structure. The second chip has at least one electrode for cooperating with the moveable structure of the first chip, and a plurality of pads disposed on one side of the second chip. The spacer ring is disposed between the first chip and the opposite second chip and surrounds the moveable structure. The bumps are disposed on the pads. The lead has a first surface, which is connected to the bumps, and an opposite second surface. The encapsulant encapsulates the first chip, the second chip, the spacer ring, the bumps, and the first surfaces of the leads, and the second surfaces of the leads are exposed out of the encapsulant.

11 Claims, 15 Drawing Sheets

MICROMACHINE PACKAGE AND METHOD FOR MANUFACTURING THE SAME

CROSS REFERENCE TO RELATED APPLICATION

This application claims the priority benefit of Taiwan patent application Ser. No. 092120272, filed on Jul. 24, 2003, and the full disclosure thereof is incorporated herein by reference.

BACKGROUND OF THE INVENTION

1. Field of the Invention

The present invention relates to a semiconductor package and a manufacturing method therefor, and more particularly, to a micromachine package with a hermetic cavity and a manufacturing method therefor.

2. Description of the Related Art

Micromachines, such as micromachine sensing elements and micromirrors, are well known. A micromachine includes a miniature moveable structure, such as a cantilevered beam, capacitive element, yoke and hinge. This micromachine usually cooperates with semiconductor elements, such as complimentary metal-oxide semiconductors (CMOS), to cause the movement of the moveable structure. Since the operation of the micromachine depends upon the moveability of the miniature moveable structure, it is critical that the package, which includes the micromachine, does not contact the miniature moveable structure in any manner.

Many micromachine packages have been disclosed in prior art, such as that disclosed in U.S. Pat. No. 6,415,505, which is incorporated herein by reference. Referring to FIG. 1, it depicts a micromachine package 10 in prior art. The micromachine package 10 includes a micromachine chip 14 with a moveable structure 16 which is disposed on a substrate 20 and electrically connected to the substrate 20 by way of bonding wires 18. A cap 12 covers the micromachine chip 14 for forming a cavity 30 surrounding the micromachine chip 14 such that the moveable structure 16 is freely moveable within the cavity 30. An encapsulant 24 encapsulates the micromachine chip 14, the substrate 20, the bonding wires 18 and the cap 12. The substrate 20 is further provided with a plurality of solder balls 22 for being electrically connected to an external print circuit board (not shown).

Further referring to FIG. 2, it depicts another micromachine package 10' in prior art. The micromachine package 10' is similar to the micromachine package 10, wherein the similar elements are designated with the same reference numerals. The micromachine chip 14 of the micromachine package 10' is disposed on a die pad 32 of a lead frame 40 and the bonding wires 18 are connected to inner leads 34 of the lead frame 40. The lead frame 40 is further provided with a plurality of outer leads 36 for being electrically connected to an external print circuit board (not shown).

Referring to FIG. 3, it depicts a micromachine package 50 in prior art. The micromachine package 50 includes a micromirror chip 54 having moveable structures 55 and a CMOS chip 52 having electrodes 53 corresponding to the moveable structures 55. The micromirror chip 54 is disposed on the CMOS chip 52 and uniformly spaced apart from the CMOS chip 52 by spacers 56 to form a cavity 80 such that the moveable structures 55 cooperate with the electrodes 53 and freely move within the cavity 80. The CMOS chip 52 is electrically connected to a ceramic substrate 60 by bonding wires 58. The ceramic substrate 60 is provided with a dam 62 surrounding the CMOS chip 52, and a transparent lid 66 is fixed on the dam 62 by a seal 64.

As the need has arisen for lighter and more complex electronic devices, the velocity and the complexity of IC chip become more and more higher. Accordingly, a need has arisen for higher package efficiency. The semiconductor package manufactured at wafer level, for example, disclosed in U.S. Pat. Nos. 5,323,051, 5,925,936, and 6,004,867, provides many advantages, such as the ability of mass production, small package size, and reduced probability of contamination of wafer. Also, leadless chip carriers or leadless packages are emphasized because of their low inductance loss. However, there is no suitable semiconductor package or manufacturing method provided in the prior art for packaging semiconductors at wafer level as well as fulfilling the requirements of semiconductor packages.

Accordingly, there exists a need for a semiconductor micromachine package to be packaged at wafer level.

SUMMARY OF THE INVENTION

It is an object of the present invention to provide a semiconductor package with a micromachine device.

In order to achieve the above-mentioned object, the present invention provides a micromachine package comprising a first chip, a second chip, a spacer ring, a plurality of bumps, a plurality of leads, and an encapsulant. The first chip has at least one moveable structure. The second chip has at least one electrode for cooperating with the moveable structure of the first chip, and a plurality of pads disposed on one side of the second chip. The spacer ring is disposed between the first chip and the second chip and surrounds the moveable structure. The bumps are disposed on the pads. The lead has a first surface, which is connected to the bump, and an opposite second surface. The encapsulant encapsulates the first chip, the second chip, the spacer ring, the bumps, and the first surfaces of the leads, and the second surfaces of the leads are exposed out of the encapsulant.

The semiconductor micromachine package according to the present invention is manufactured at the wafer level, so the probability of the contamination of the chip can be reduced and the package can be mass-produced. Further, the package according to the present invention is a leadless package and, therefore, the inductance loss of the package is relatively low.

BRIEF DESCRIPTION OF THE DRAWINGS

Other objects, advantages, and novel features of the invention will become more apparent from the following detailed description when taken in conjunction with the accompanying drawings.

DESCRIPTION OF THE PREFERRED EMBODIMENT

Figure 1:
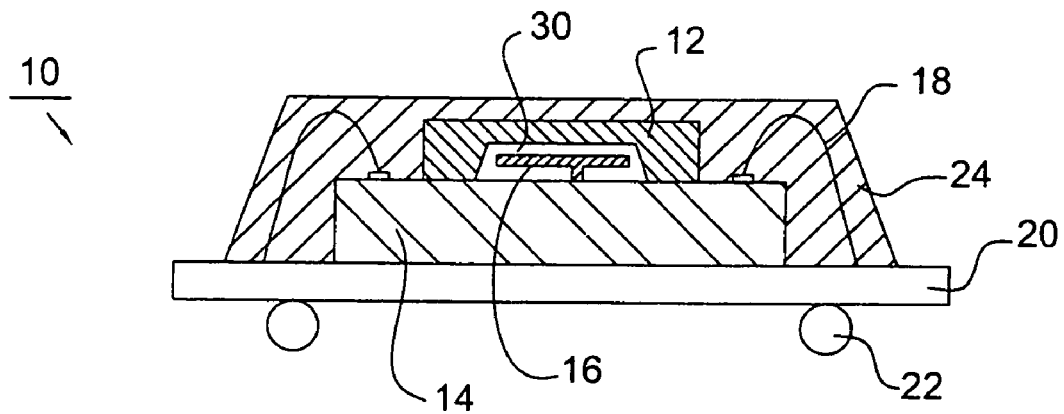
FIG. 1 is a schematic cross-sectional view of a micromachine package in prior art.
Figure 2:
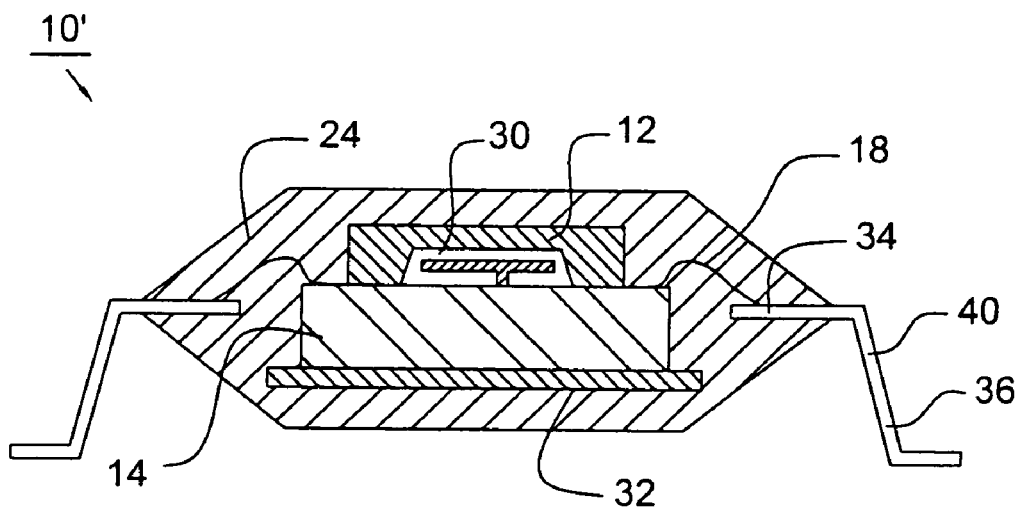
FIG. 2 is a schematic cross-sectional view of another micromachine package in prior art.
Figure 3:
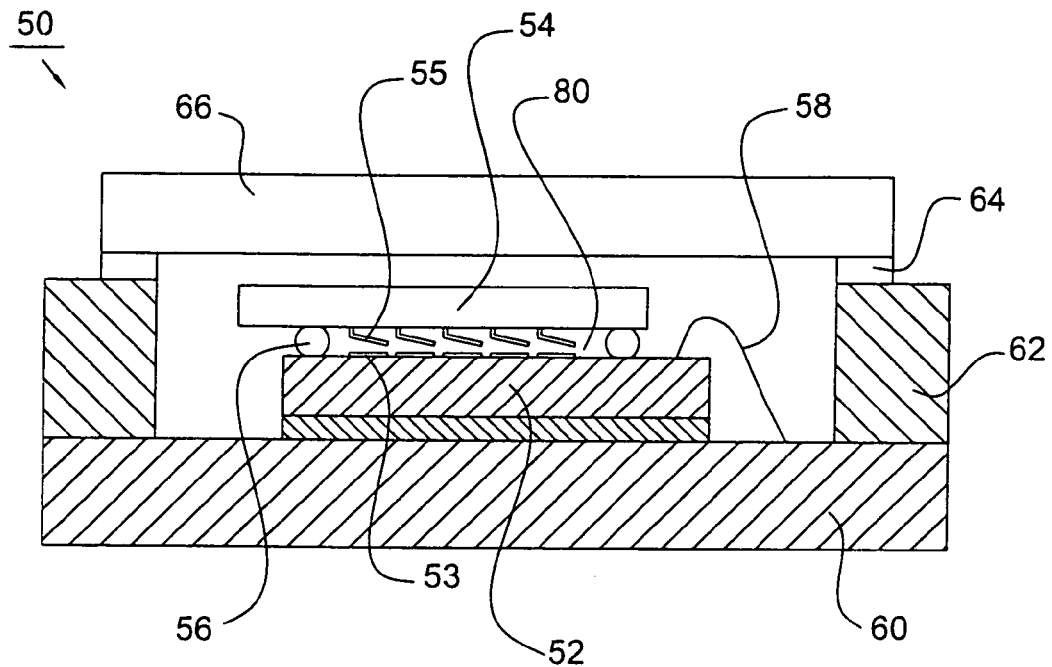
FIG. 3 is a schematic cross-sectional view of a micromirror package in prior art.
Figure 4:
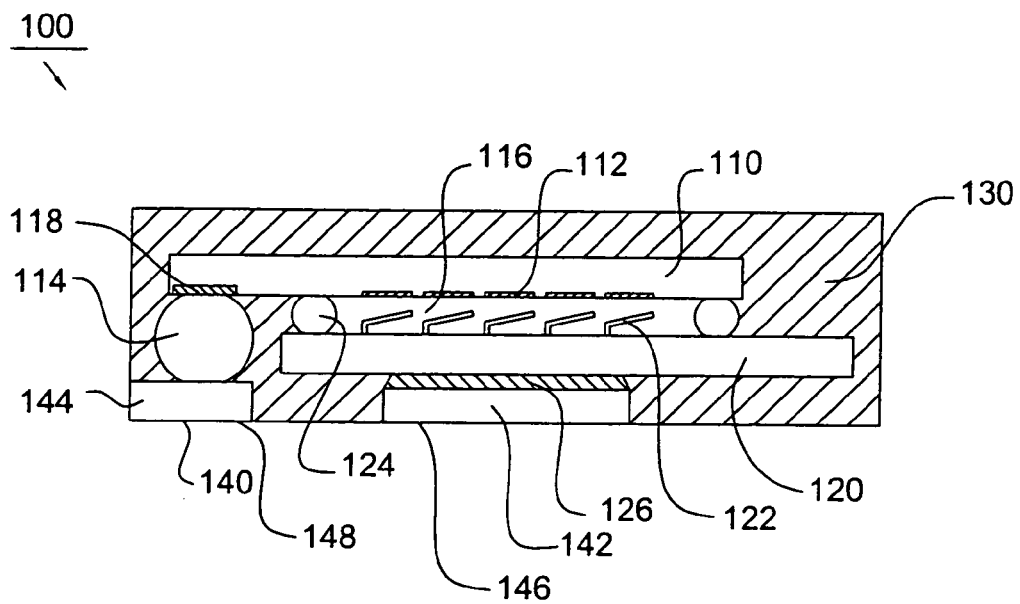
FIG. 4 is a schematic cross-sectional view of a micromachine package according to an embodiment of the present invention.

Now referring to FIG. 4, it depicts a micromachine package 100 according to an embodiment of the present invention. The micromachine package 100 comprises a micromachine chip 120 having moveable structures 122, such as micromachines or micromirrors, and a semiconductor chip 110, such as complimentary metal-oxide semiconductor (CMOS), having electrodes 112 corresponding to the moveable structures 122. The semiconductor chip 110 is fixed on the micromachine chip 120 by means of an adhesive or a spacer ring 124, and is uniformly spaced apart from the micromachine chip 120. A cavity 116 is formed between the semiconductor chip 110 and the micromachine chip 120 so that the moveable structures 122 cooperate with the electrodes 112 and freely move within the cavity 116.

It should be noted that the moveable structures 122 and electrodes 112 are disposed on the chip 120 and the chip 110, respectively.

The micromachine chip 120 is attached on a die pad 142 of a lead frame 140 by means of an adhesive 126. The adhesive 126 can be a conductive paste for electrically connecting the micromachine chip 120 to the die pad 142. The semiconductor package 100 is provided with a plurality of solder pads 118 disposed on the two adjacent sides thereof, which will be described hereinafter, and electrically connected to the electrodes 112. The solder pad 118 is connected to a bump 114, such as a gold bump or a solder bump. The bumps 114 are individually disposed on a plurality of leads 144 of the lead frame 140. An encapsulant 130 encapsulates the micromachine chip 120, the semiconductor chip 110, the bumps 114, and the lead frame 140. The leads 144 and the die pad 142 of the lead frame 140 respectively have lower surfaces 148 and a lower surface 146 which are exposed out of and are flush with the encapsulant 130 for being connected to an external print circuit board (not shown). Therefore, the leads 144 are referred to Quad Flat No-lead (QFN)-type leads. The lower surface 146 of the die pad 142 can also be used for grounding or dissipating heat.

It will be apparent to those skilled in the art that the moveable structure 122 of the micromachine chip 120 can be a sensor element.

Alternatively, the moveable structure 122 can be an optical element, such as a micromirror. In this case, the encapsulant 130 is made of transparent material. The semiconductor chip 110 is also provided with a transparent portion for receiving or transmitting light.

Now referring to FIG. 5–FIG. 13, they depict the manufacturing method of the micromachine package 100 according to the present invention. In the accompanying drawings, the same reference numerals refer to the same members throughout.

Figure 5:
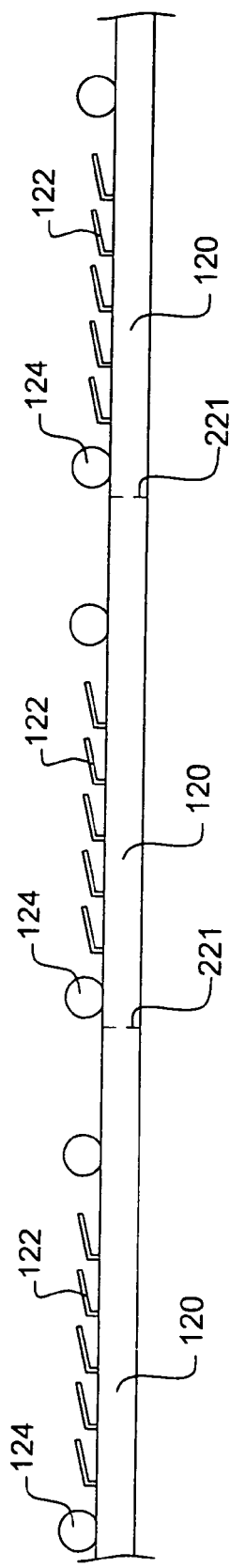
FIGS. 5–13 are schematic views for showing the manufacturing method of a micromachine package according to an embodiment of the present invention.
Figure 6:
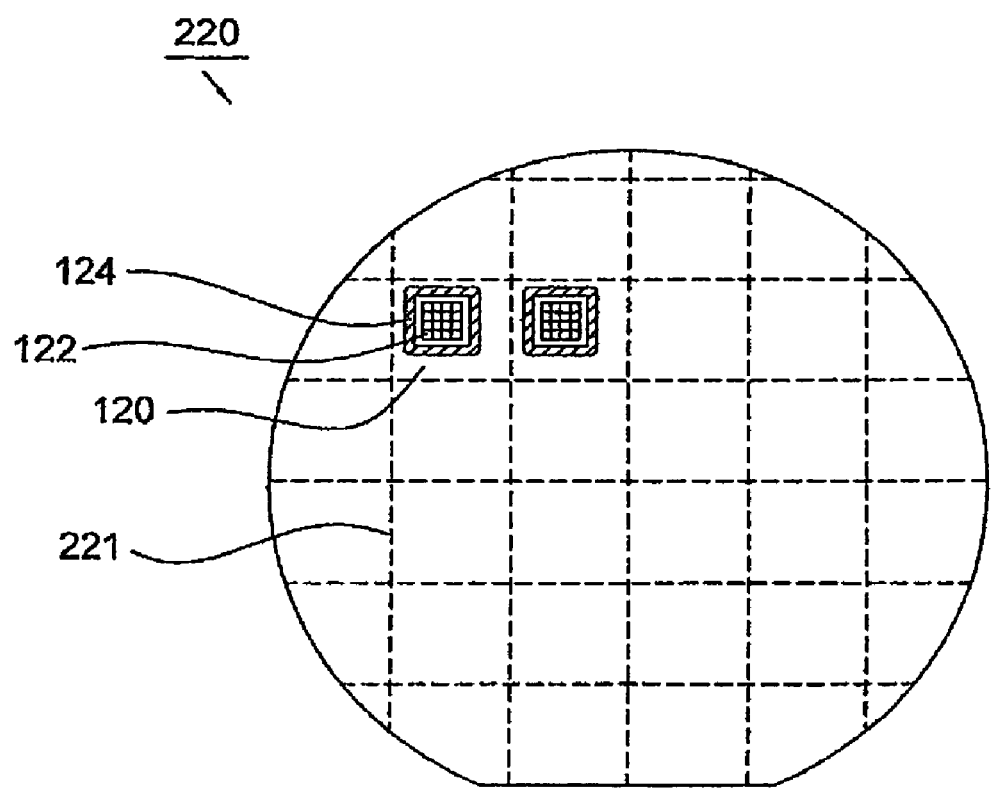

As shown in FIG. 5, a micromachine wafer 220 includes a plurality of micromachine chips 120 separated from each other by scribe lines 221, as the phantom lines shown in FIG. 5. The scribe lines 221 are disposed on the upper surface of the micromachine wafer 220 and are shown in FIG. 6. Spacer rings 124 are disposed on the upper surface of the micromachine wafer 220, and individually surround the moveable structures 122 of the micromachine chip 120. The spacer ring 124 can be formed by dispensing or by a photolithography process and be provided with adhesive and spacers.

FIG. 6 is an upper plan view of the micromachine wafer 220 shown in FIG. 5, and depicts the micromachine wafer 220 having the micromachine chips 120 separated from each other by the scribe lines 221 and each having the moveable structures 122. The spacer rings 124 surround the moveable structures 122 of the micromachine chip 120.

Figure 7:
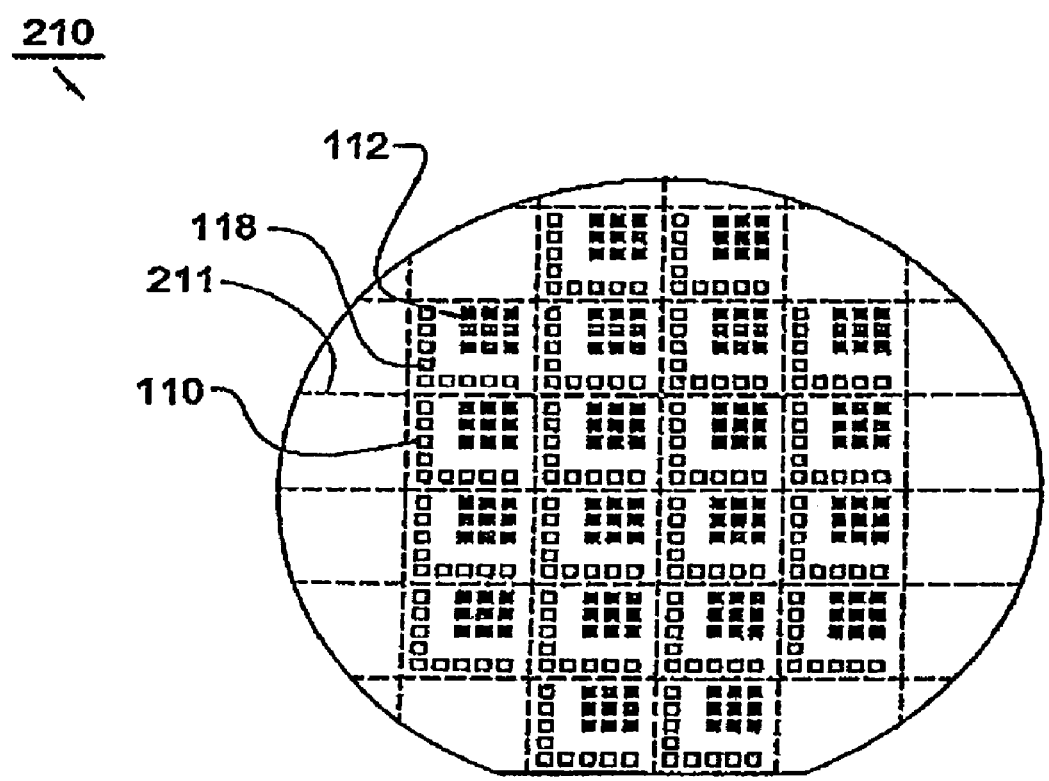

Referring to FIG. 7, it depicts a semiconductor wafer 210 having a plurality of semiconductor chips 110 separated from each other by scribe lines 211, as the phantom lines shown in FIG. 7. The scribe lines 211 are disposed on the upper surface of the semiconductor wafer 210. A plurality of solder pads 118 are disposed on the two adjacent sides of the semiconductor chips 110 and electrically connected to the electrodes 112.

In addition, the moveable structure 122 can be an optical element, and, therefore, the semiconductor wafer 210 is a transparent substrate, such as a glass substrate and the electrode 112 is a transparent electrode, such as made of Indium Tin Oxide (ITO).

Figure 8:
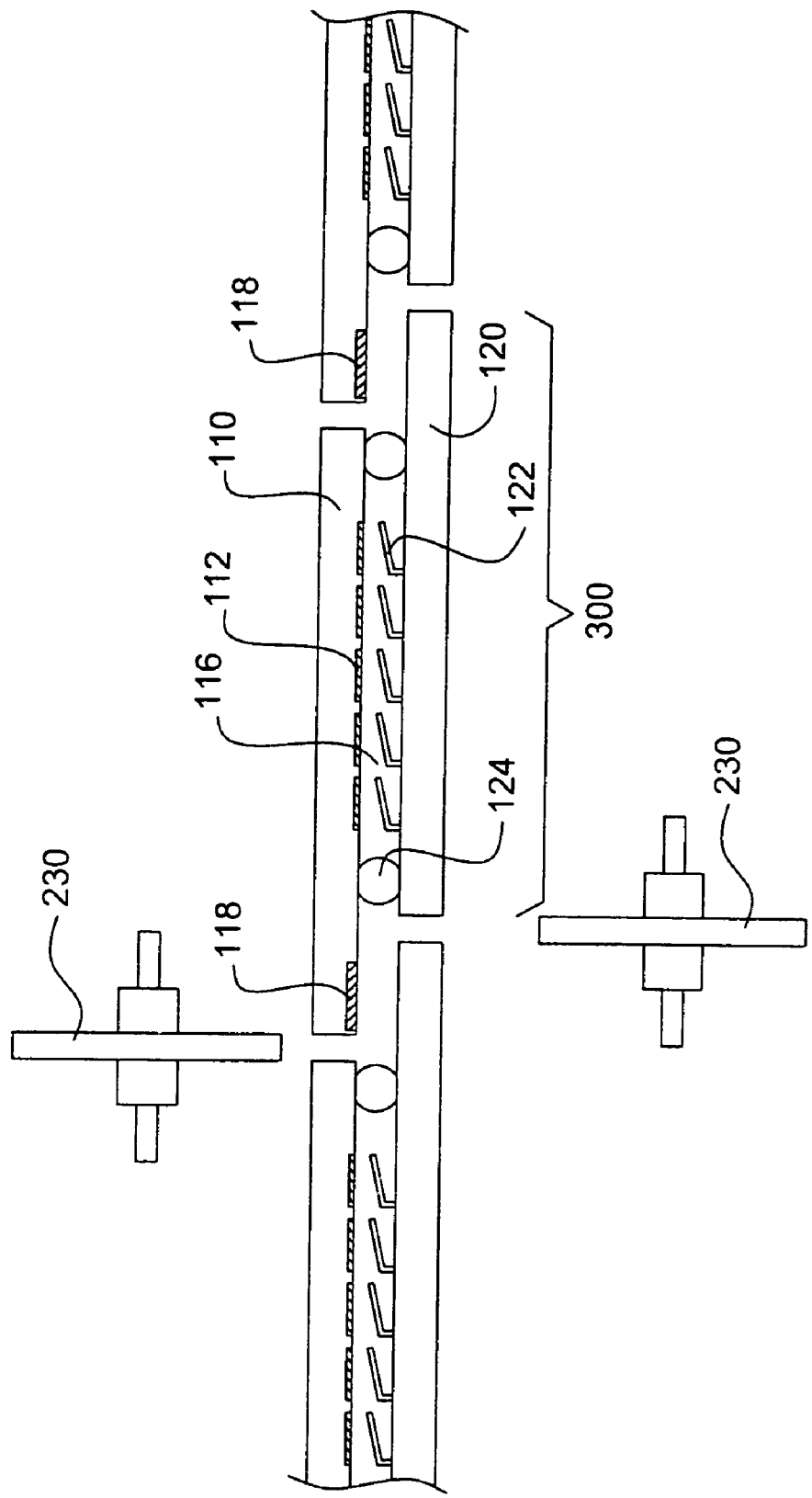

Referring to FIG. 8, it depicts a wafer-to-wafer bonding process. The semiconductor wafer 210 is aligned with the micromachine wafer 220 such that the electrodes 112 of the semiconductor chip 110 are corresponding to the moveable structures 122 of the micromachine chip 120 and the solder pads 118 of the semiconductor chip 110 are positioned outside the scribe lines 221 of the micromachine wafer 220. The semiconductor wafer 210 and the micromachine wafer 220 are bonded together by the spacer rings 124.

Figure 9:
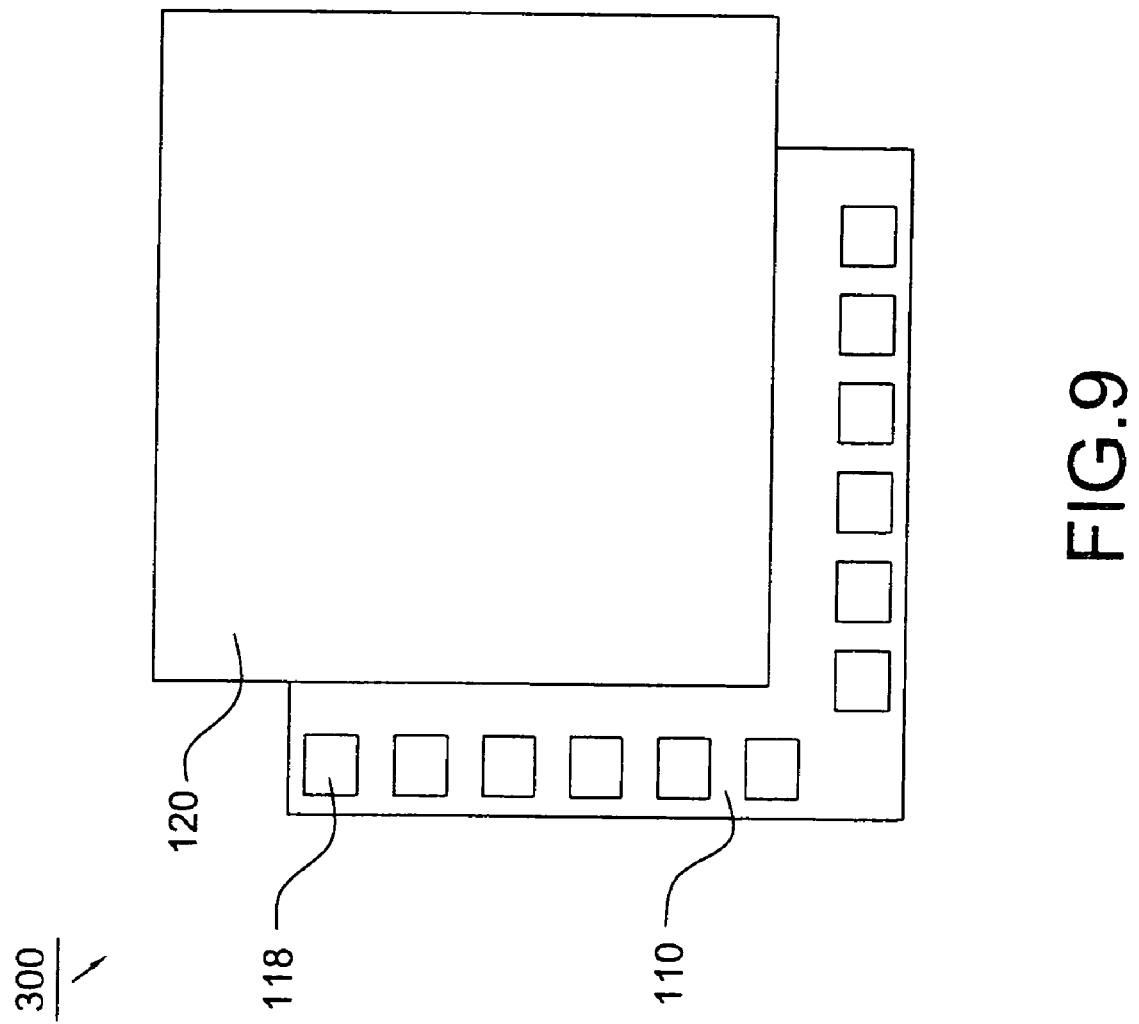

Cutting blades 230 cut the micromachine wafer 220 and the semiconductor wafer 210 respectively along the scribe lines 221 and the scribe lines 211 so as to form a combined chip 300, as shown in FIG. 9. In the cutting process, the cutting blades 230 can cut grooves or notches along the scribe lines 221, 211 and then the micromachine wafer 220 and the semiconductor wafer 210 are split by machining so as to prevent the cutting blades 230 from over-cutting and damaging the combined chip 300.

Figure 10:
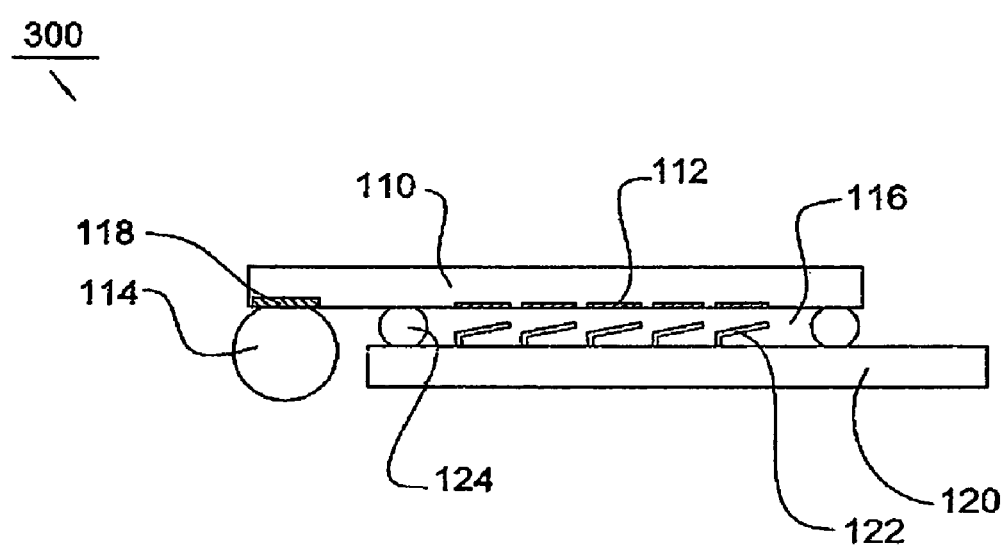

Referring to FIG. 10, bumps 114 are disposed on the solder pads 118 of the combined chip 300. It will be apparent to those skilled in the art that the solder pads 118 can be covered with an under bump metallurgy (UBM), not shown, to facilitate the attaching of the bumps 114 on the solder pads 118.

Figure 11:
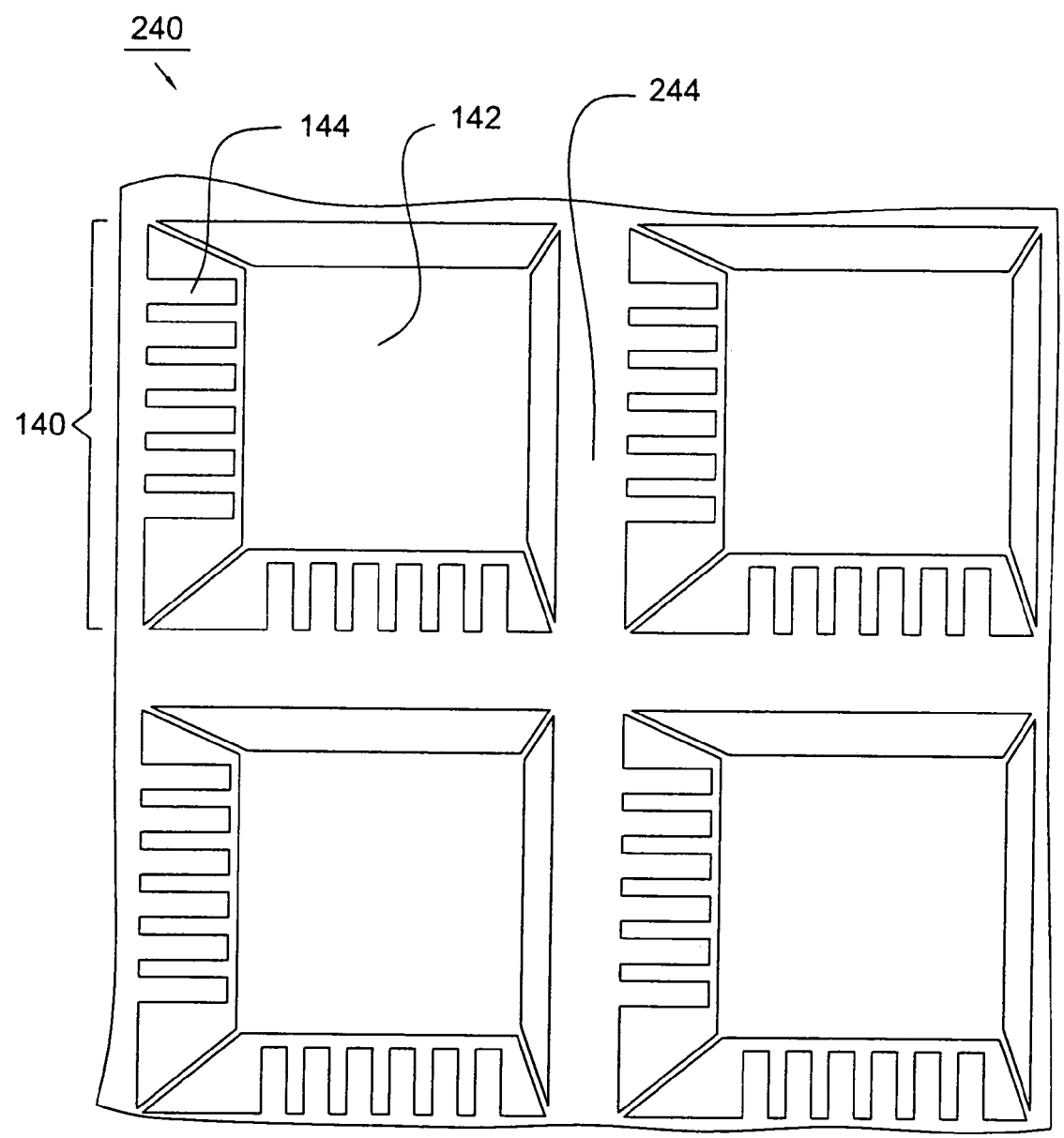

Referring to FIG. 11, it depicts a lead frame strip 240 according to the present invention, which has a plurality of frames 244 supporting a plurality of lead frames 140. The lead frame 140 is provided with a die pad 142 connected to the frames 244 by tie bars 242, and a plurality of leads 144 connected to the frames 244.

Figure 12:
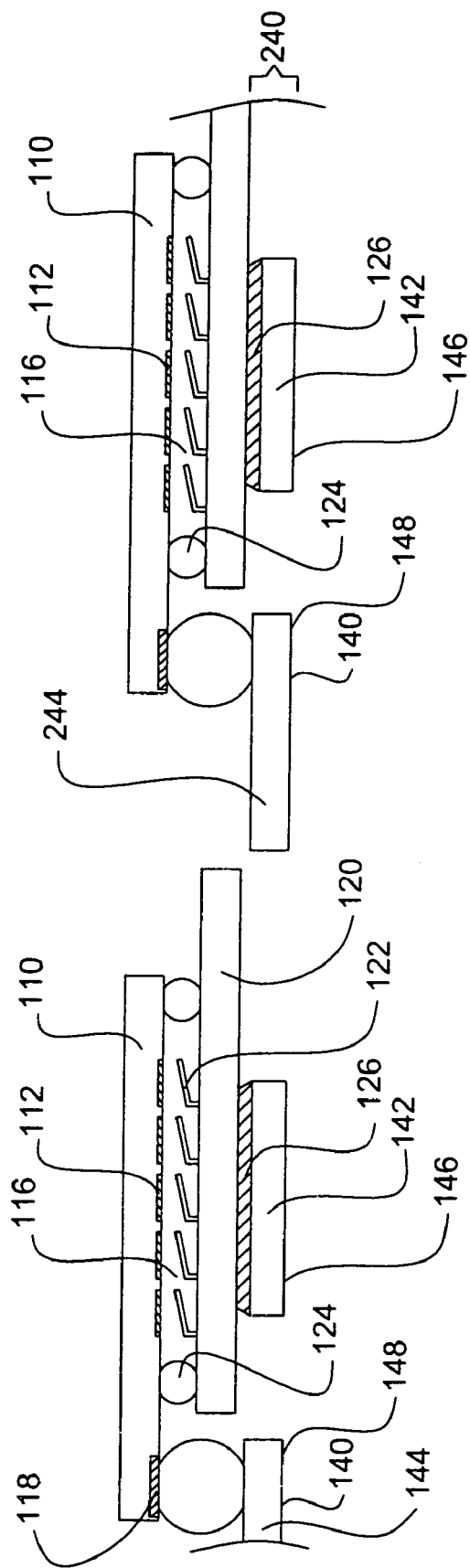

Referring to FIG. 12, the combined chip 300 is disposed on the lead frame 140. An adhesive 126 is coated on the die pad 142 of the lead frame 140, and the micromachine chip 120 is attached to the adhesive 126. The adhesive 126 can be a silver paste. The bumps 114 are first positioned on the leads 144 and then can be connected to the leads 144 by a reflow process.

Figure 13:
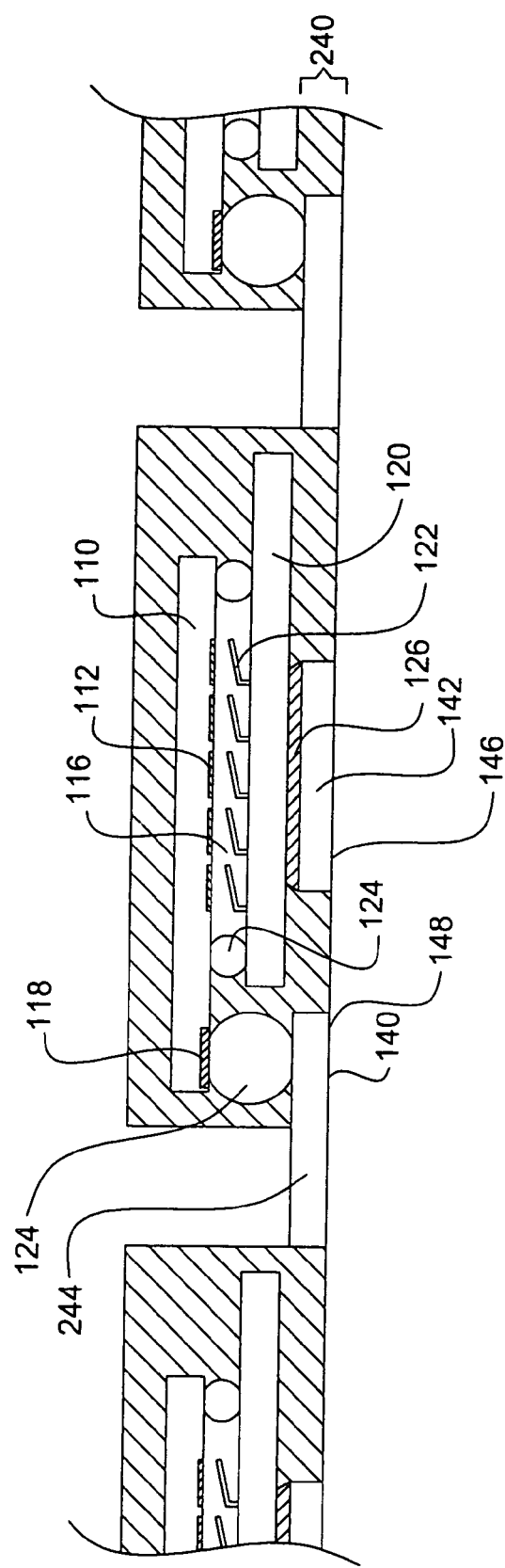

Referring to FIG. 13, an encapsulant 130 is molded on the lead frame 140 for encapsulating the combined chip 300, the bumps 114, and the lead frame 140 and the lower surfaces 148 of the leads 144 and the lower surface 146 of the die pad 142 are exposed out of the encapsulant 130. Last, the frames 244 of the lead frame strip 240 are cut or etched away to form the micromachine package 100.

Figure 14:
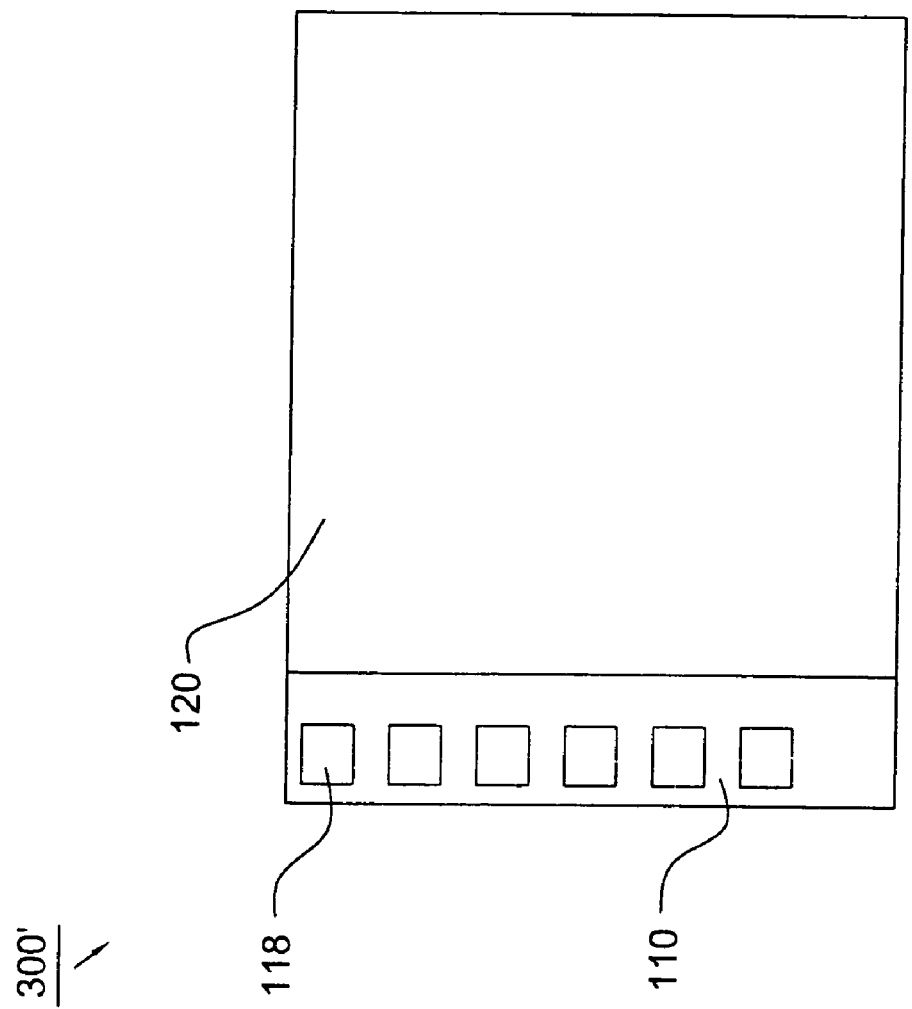
FIG. 14 is a schematic bottom plan view of a combined chip of a micromachine package according to another embodiment of the present invention.
Figure 15:
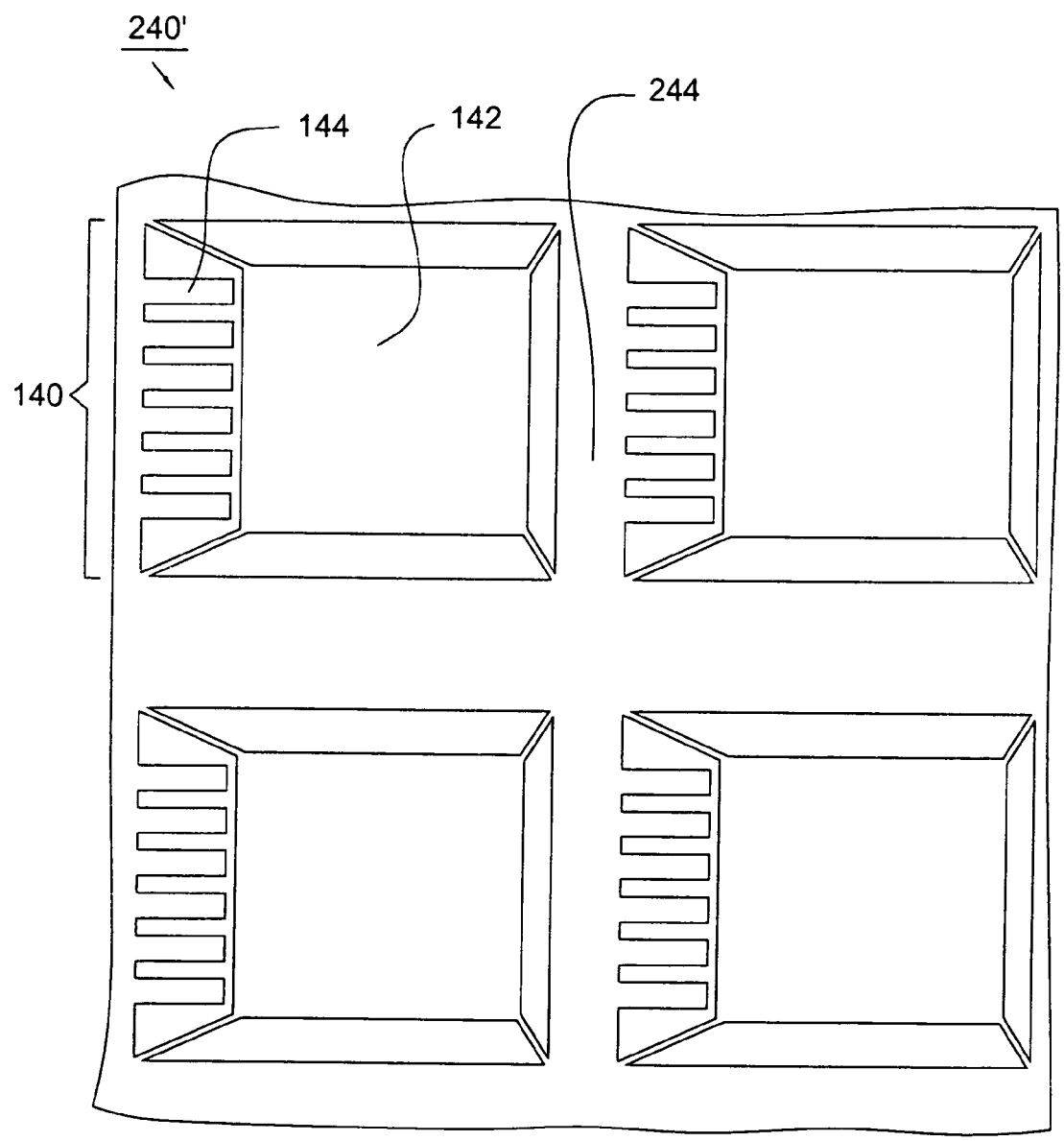
FIG. 15 is a schematic bottom plan view of a lead frame of a micromachine package according to another embodiment of the present invention.

Referring to FIGS. 14 and 15, they depict a combined chip 300' and a lead frame strip 240' according to another embodiment of the present invention, which are similar to the combined chip 300 and the lead frame strip 240, wherein the similar elements are designated with the same numerals. The solder pads 114' of the combined chip 300' are disposed on one side of the semiconductor chip 110, and the leads 144' are also disposed on one side of the lead frame 140.

In the semiconductor micromachine package and the manufacturing method thereof according to the present invention, the semiconductor chip or micromachine chip is packaged at the wafer level, so the probability of the contamination of the chip can be reduced and the package can be mass-produced. Further, the package according to the present invention is a leadless package and, therefore, the inductance loss of the package is relatively low.

Figure 16:
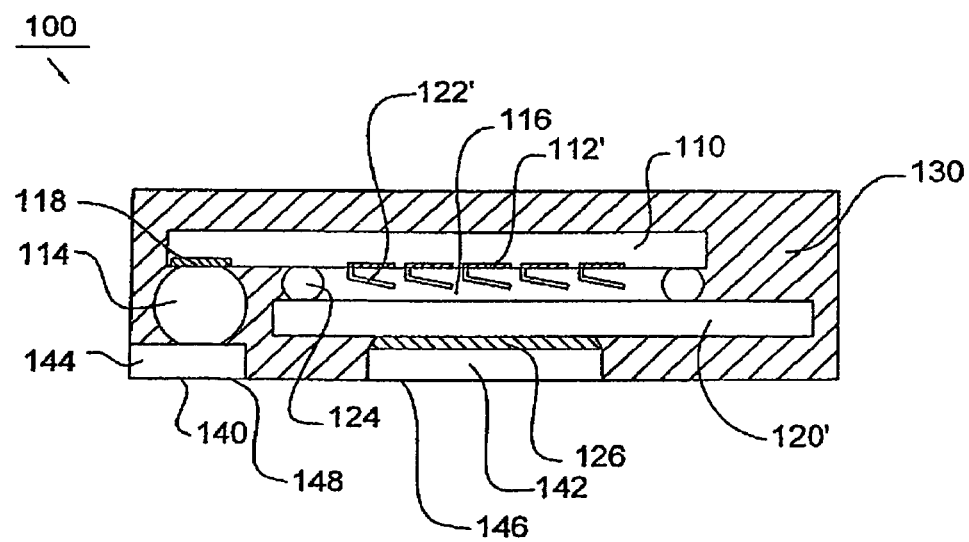
FIG. 16 is a schematic cross-sectional view of a micromachine package according to another embodiment of the present invention.

Now referring to FIG. 16, it depicts a micromachine package 100' according to another embodiment of the present invention. The micromachine package 100' is similar to the micromachine package 100, wherein the similar elements are designated with the same numerals. The micromachine package 100' is provided with moveable structures 122' and electrodes 112', both of which are disposed on a semiconductor chip 110. The moveable structures 122' are electrically connected to the solder pads 118 directly or by way of the electrodes 112'. A lid 120' is attached on the semiconductor chip 110 by an adhesive or a spacer ring 124 and spaced apart from the semiconductor package 110. Compared with the manufacturing process of the micromachine package 100, in the manufacturing process of the micromachine package 100', the micromachine wafer 220 is replaced with a lid wafer (not shown).

Figure 17:
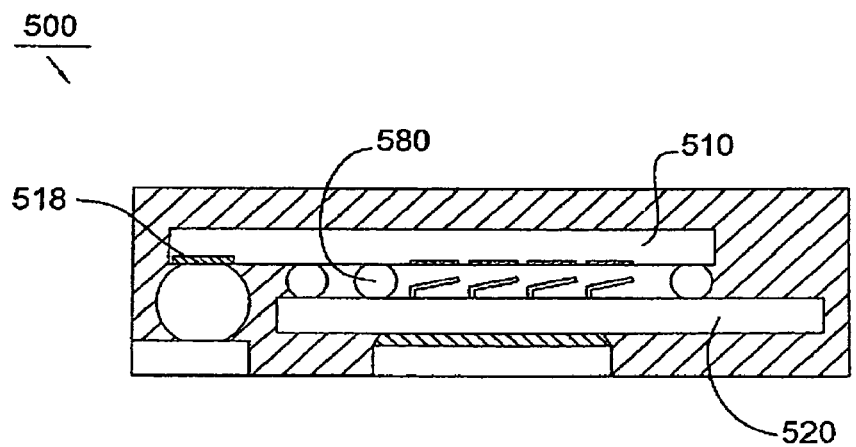
FIG. 17 is a schematic cross-sectional view of a micromachine package according to still another embodiment of the present invention.

Now referring to FIG. 17, it depicts a micromachine package 500 according to a further embodiment of the present invention. The micromachine package 500 is similar to the micromachine package 100, wherein the similar elements are designated with the similar numerals. The micromachine package 500 is further provided with a plurality of conductive bumps or solder balls 580 for electrically connecting the semiconductor chip 510 to the micromachine chip 520. In the manufacturing process of the micromachine package 500, the solder balls 580 are formed on the semiconductor chip 510 or the micromachine chip 520, and then in the combining process of the semiconductor chip 510 and the micromachine chip 520, the solder balls 580 electrically connect the semiconductor chip 510 to the micromachine chip 520.

Figure 18:
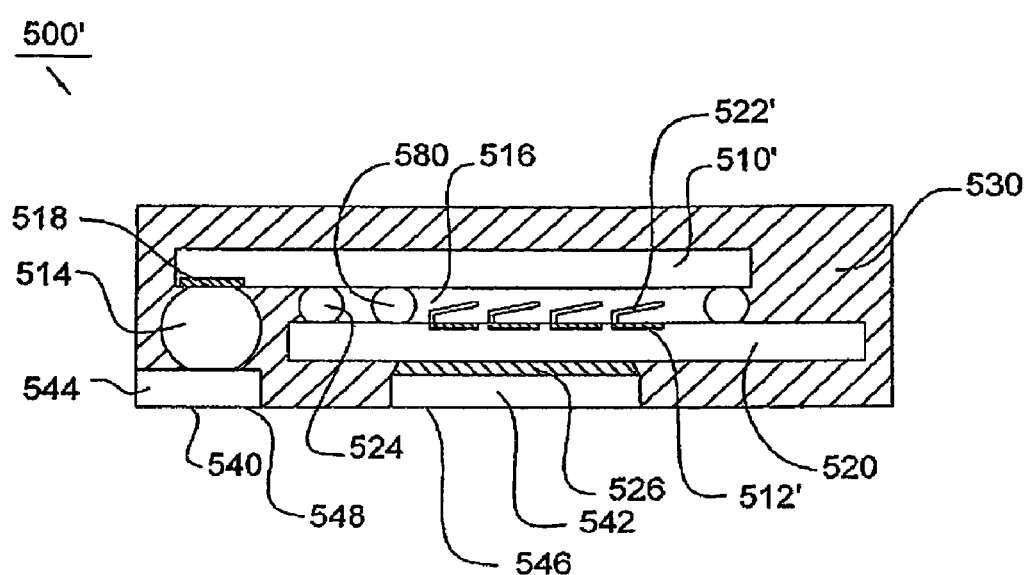
FIG. 18 is a schematic cross-sectional view of a micromachine package according to a further embodiment of the present invention.

Now referring to FIG. 18, it depicts a micromachine package 500' according to still another embodiment of the present invention. The micromachine package 500' is similar to the micromachine package 500, wherein the similar elements are designated with the same numerals. The micromachine package 500' is further provided with moveable structures 522' and electrodes 512' which both are disposed on a semiconductor chip 520 and electrically connected to a plurality of solder pads 518 of a lid 510' by way of a plurality of solder balls 580.

While the foregoing description and drawings represent the preferred embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A micromachine package comprising:
    a first chip;
    a second chip having a plurality of pads disposed on one side of the second chip;
    at least one moveable structure disposed on the first chip;
    at least one electrode for cooperating with the moveable structure said at least one electrode being disposed on the second chip;
    a spacer ring disposed between the first chip and the second chip and surrounding the moveable structure;
    a plurality of bumps disposed on the pads;
    a plurality of leads each defining a first lead surface connected to one of the bumps, and an opposite second lead surface; and
    an encapsulant encapsulating the first chip, the second chip, the spacer ring, the bumps, and the first lead surfaces of the leads, wherein the second lead surfaces of the leads are exposed out of the encapsulant.

2. The micromachine package as claimed in claim 1, further comprising:

a die pad defining a first die-pad surface and an opposite second die-pad surface, wherein the first die-pad surface is connected to the first chip and the second die-pad surface is exposed out of the encapsulant.

3. The micromachine package as claimed in claim 2, further comprising:

an adhesive for attaching the first chip to the die pad.

4. The micromachine package as claimed in claim 1, wherein the second lead surfaces of the leads are flush with the encapsulant and the leads are QFN-type leads.

5. The micromachine package as claimed in claim 1, further comprising a plurality of solder balls for electrically connecting the first chip to the second chip.

6. The micromachine package as claimed in claim 1, wherein the bump is a gold bump.

7. The micromachine package as claimed in claim 1, wherein the bump is a solder bump.

8. The micromachine package as claimed in claim 1, wherein said at least one moveable structure comprises a number of moveable structures and said at least one electrode comprises the same number of electrodes each corresponding to and disposed above one of said moveable structures.

9. The micromachine package as claimed in claim 1, wherein said second chip, as seen in a plan view, has four sides;

said pads being positioned along at least one, but not all, of said sides of said second chip.

10. The micromachine package as claimed in claim 9, wherein said pads are positioned along only two of said sides of said second chip and said at least one electrode comprises multiple electrodes positioned along the other two sides of said second chip.

11. The micromachine package as claimed in claim 1, wherein said bumps have a thickness greater than a sum of thicknesses of the spacer ring and the first chip.

* * * * *